(12) United States Patent
Chen et al.

(10) Patent No.: US 8,879,293 B2
(45) Date of Patent: Nov. 4, 2014

(54) COOLING SYSTEM OF SERVER WITH AC AND DC POWER SOURCES AND METHOD OF OPERATING THE SAME

(71) Applicant: Delta Electronics, Inc., Taoyuan County (TW)

(72) Inventors: Yen-Chang Chen, Taoyuan County (TW); Chien-Chung Lee, Taoyuan County (TW); Chen-Yu Huang, Taoyuan County (TW); Yu-Chieh Tseng, Taoyuan County (TW)

(73) Assignee: Delta Electronics, Inc. (TW)

( * ) Notice: Subject to any disclaimer, the term of this patent is extended or adjusted under 35 U.S.C. 154(b) by 170 days.

(21) Appl. No.: 13/743,873

(22) Filed: Jan. 17, 2013

(65) Prior Publication Data

US 2014/0103713 A1 Apr. 17, 2014

(30) Foreign Application Priority Data

Oct. 12, 2012 (TW) .............................. 101137843 A (51) Int. Cl.
  *H05K 7/20* (2006.01)
  *H02M 7/48* (2006.01)
  *H02J 9/06* (2006.01)
  *G06F 1/26* (2006.01)

(52) U.S. Cl.
  CPC .... *H02J 9/06* (2013.01); *G06F 1/26* (2013.01)
  USPC ............................................ 363/141; 363/71

(58) Field of Classification Search
  USPC .................................. 363/65, 71, 141; 307/23
  See application file for complete search history.

(56) References Cited

U.S. PATENT DOCUMENTS

| 8,130,501 B2 * | 3/2012 | Ledezma et al. ............... 361/727 |
| 8,134,836 B2 * | 3/2012 | Tsai et al. ...................... 361/715 |
| 2008/0304303 A1 * | 12/2008 | Hsieh et al. .................... 363/141 |

* cited by examiner

*Primary Examiner* — Emily P Pham
(74) *Attorney, Agent, or Firm* — Lowe Hauptman & Ham, LLP (57) ABSTRACT

A cooling system of a server with an AC power source and a DC power source includes an AC input subsystem, a DC input subsystem, and a driving control subsystem. The AC input subsystem receives an external AC power source and provides a first DC voltage and a second DC voltage. The DC input subsystem receives an external DC power source and provides a third DC voltage and a fourth DC voltage. When the external AC power source normally works, the driving control subsystem controls the first DC voltage and the second DC voltage to supply a high-voltage cooling apparatus and a low-voltage cooling apparatus, respectively. When the external DC power source normally works, the driving control subsystem controls the fourth DC voltage and the third DC voltage to supply the high-voltage cooling apparatus and the low-voltage cooling apparatus, respectively.

13 Claims, 7 Drawing Sheets

ND DC POWER SOURCES AND METHOD
COOLING SYSTEM OF SERVER WITH AC AND DC POWER SOURCES AND METHOD OF OPERATING THE SAME

This application is based on and claims the benefit of Taiwan Application No. 101137843 filed Oct. 12, 2012 the entire disclosure of which is incorporated by reference herein.

BACKGROUND

1. Technical Field

The present disclosure relates generally to a cooling system of a server and a method of operating the same, and more particularly to a cooling system of a server with an AC power source and a DC power source and a method of operating the same.

2. Description of Related Art

In enclosed cabinet equipment, it is usually to exhaust superfluous heat inside the cabinet to the outside of the enclosed cabinet to maintain the operating temperature within the cabinet, thus making the equipment inside the cabinet being stably operated. When the traditional fixed-frequency air conditioner starts up, the instantaneous current, vibration, and noise are significant so as to not only cause large power consumption but reduce use life of the compressor. In addition, the traditional cooling system for the cabinet is mostly supplied power by single AC power source or single DC power source so as to indirectly limit flexibility of supplying power. Furthermore, the AC power source or the DC power source is selected according to the actual power supply environment. Once unusual AC power source or DC power source occurs, however, the air conditioning system has to stop operations until the AC power source or the DC power source is restored to normal.

Figure 1:
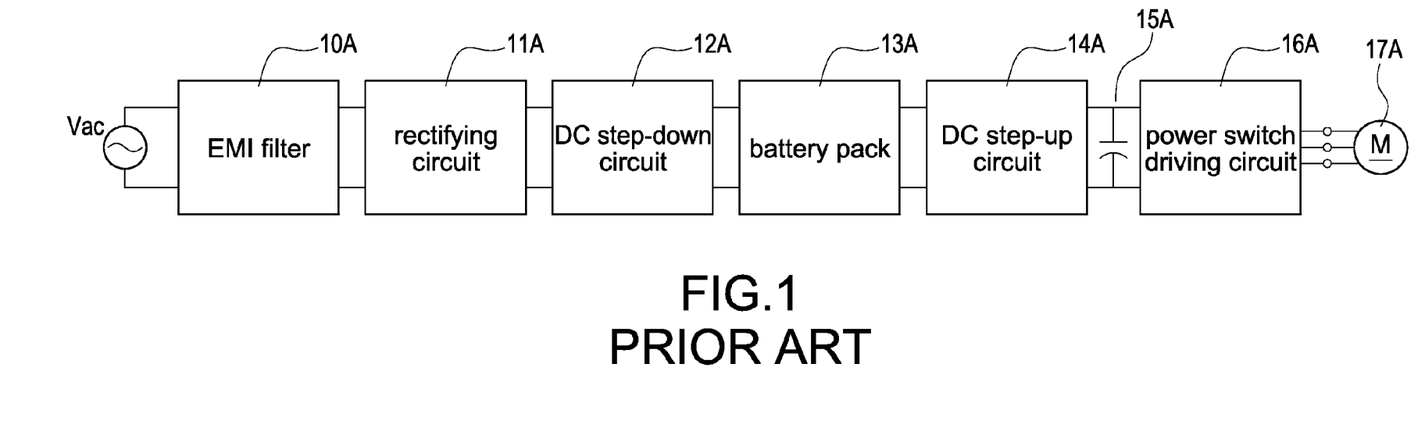
FIG. 1 is a circuit block diagram of a prior art two-stage power converter.

Reference is made to FIG. 1 which is a circuit block diagram of a prior art two-stage power converter. As mentioned above, the single power source would indirectly limit flexibility of supplying power for the air conditioning system. In this example, the battery cabinet is exemplified for further demonstration. A battery pack 13A is normally charged by a low-voltage DC voltage by converting an AC power source Vac so as to store electricity therein. Hence, the battery pack 13A can be regarded as a fixed-voltage DC voltage source. As shown in FIG. 1, the first stage of the two-stage power converter is that the AC power source Vac is converted into a DC voltage via an EMI filter 10A and a rectifying circuit 11A, and then the DC voltage is converted into a low-voltage DC power source by a DC step-down circuit 12A. In addition, the second stage of the two-stage power converter is that the low-voltage DC power source is converted into a high-voltage DC power source by a DC step-up circuit 14A, and then the high-voltage DC power source is provided to drive a compressor 17A via a capacitor 15A and a power switch driving circuit 16A. However, the two-stage power converter would significantly reduce the power supplying efficiency of the air conditioning system.

Figure 2:
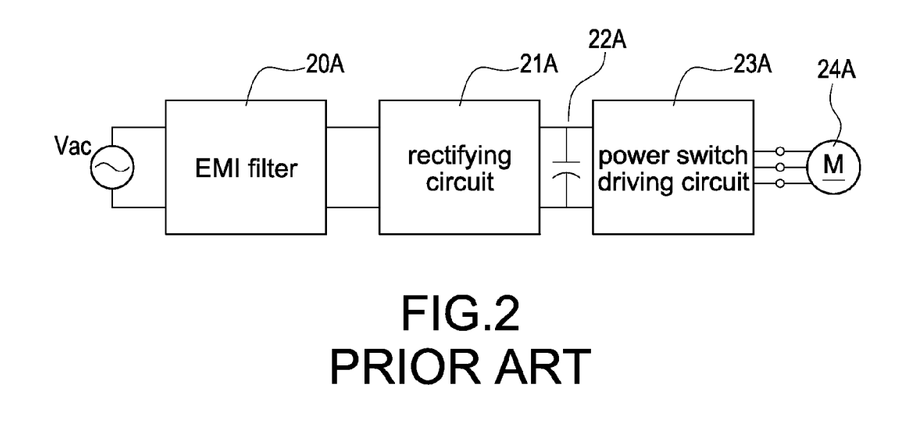
FIG. 2 is a circuit block diagram of a prior art single-stage power converter.

Reference is made to FIG. 2 which is a circuit block diagram of a prior art single-stage power converter. As shown in FIG. 2, an AC power source Vac (such as a utility power source) is converted into a DC power source via an EMI filter 20A, a rectifying circuit 21A, and a capacitor 22A, and then the DC power source is provided to drive a compressor 24A via a power switch driving circuit 23A. The single-stage power converter is used to convert the AC power source Vac to produce the high-voltage DC power source for the air conditioning system. Because of the absence of the two-stage power conversion, it is to reduce power conversion losses thus increasing power supplying efficiency. Once unusual AC power source Vac occur, however, the air conditioning system has to stop operations until the AC power source Vac is restored to normal.

Accordingly, it is desirable to provide a cooling system of a server with an AC power source and a DC power source and a method of operating the same so that the AC power source and the DC power source can be alternatively used to increase the flexibility, the reliability, and the safety of supplying power for the cooling system.

SUMMARY

An object of the invention is to provide a cooling system of a server with an AC power source and a DC power source to solve the above-mentioned problems. Accordingly, the cooling system is electrically connected to an external AC power source and an external DC power source to drive at least one high-voltage cooling apparatus and at least one low-voltage cooling apparatus. The cooling system includes an AC input subsystem, a DC input subsystem, and a driving control subsystem. The AC input subsystem receives the external AC power source to provide a first DC voltage and a second DC voltage, wherein the second DC voltage is provided by stepping down the first DC voltage. The DC input subsystem receives the external DC power source to provide a third DC voltage and a fourth DC voltage, wherein the fourth DC voltage is provided by stepping up the third DC voltage. The driving control subsystem is electrically connected to the AC input subsystem and the DC input subsystem to receive the first DC voltage, the second DC voltage, the third DC voltage, and the fourth DC voltage. Wherein the driving control subsystem controls the first DC voltage and the second DC voltage to respectively supply power to the high-voltage cooling apparatus and the low-voltage cooling apparatus when the external AC power source normally supplies power; the driving control subsystem controls the fourth DC voltage and the third DC voltage to respectively supply power to the high-voltage cooling apparatus and the low-voltage cooling apparatus when the external DC power source normally supplies power and the external AC power source does not normally supply power.

Another object of the invention is to provide a method of operating a cooling system of a server with an AC power source and a DC power source to solve the above-mentioned problems. Accordingly, the method includes following steps: (a) an external AC power source and an external DC power source are introduced to the cooling system to build an auxiliary power source for a driving control stage, and then controlling the cooling system being operated in a standby condition; (b) the external AC power is judged whether normal or not, wherein a DC control switch is turned off and an AC control switch is turned on when the external AC power source is normal, thus controlling the cooling system being operated in an AC operation condition; (c) the AC control switch is turned off and the DC control switch is turned on when the external AC power source is abnormal; (d) the external DC power source is judged whether normal or not, wherein the cooling system is controlled being operated in a DC operation condition when the external DC power source is normal; and (e) the cooling system is controlled to be operated in a standby condition when the external DC power source is abnormal.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF DRAWINGS

The features of the present disclosure believed to be novel are set forth with particularity in the appended claims. The present disclosure itself, however, may be best understood by reference to the following detailed description of the present disclosure, which describes an exemplary embodiment of the present disclosure, taken in conjunction with the accompanying drawings, in which:

DETAILED DESCRIPTION

Reference will now be made to the drawing figures to describe the present invention in detail.

Figure 3:
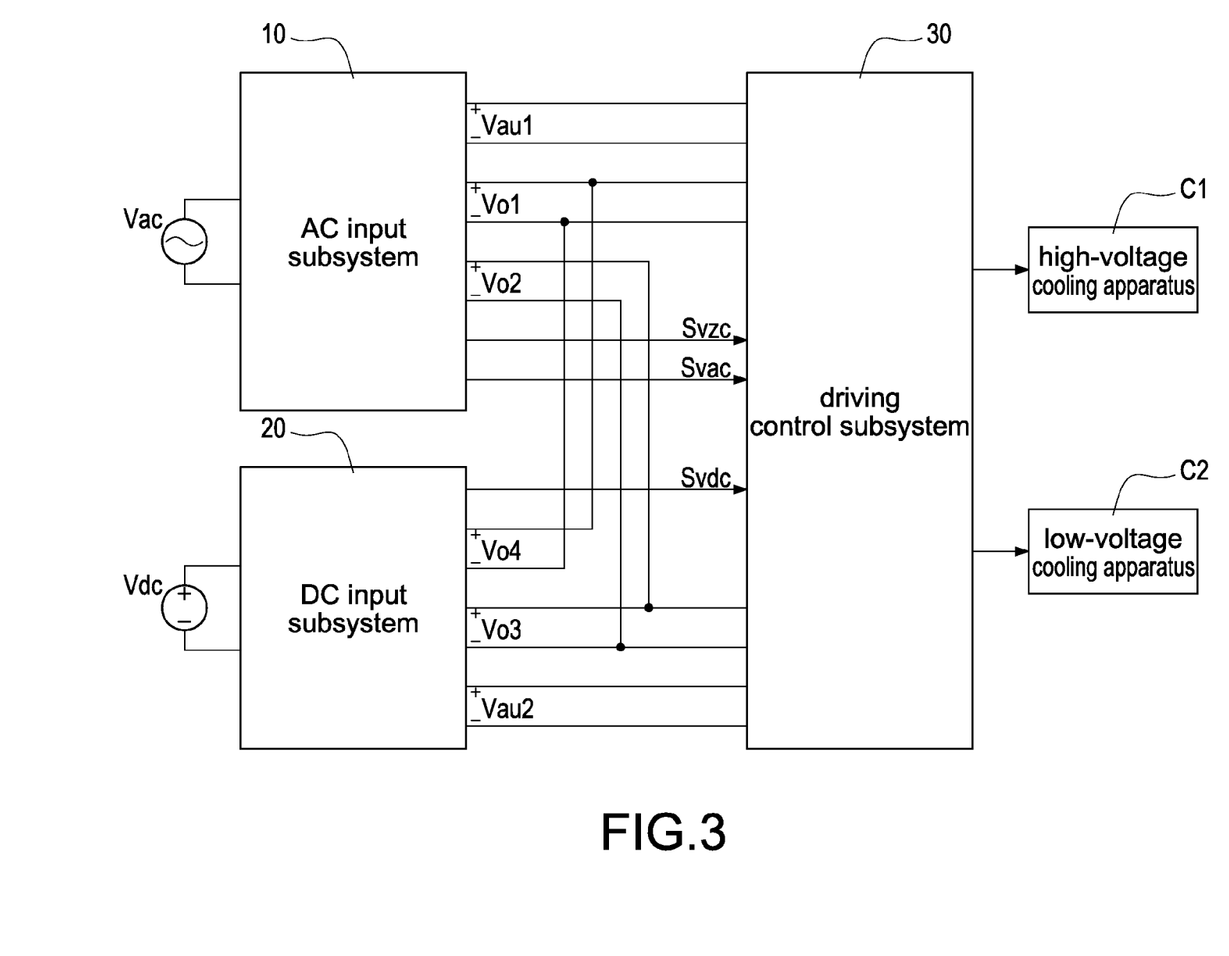
FIG. 3 is a schematic block diagram of a cooling system of a server with an AC power source and a DC power source according to the present invention.

Reference is made to FIG. 3 which is a schematic block diagram of a cooling system of a server with an AC power source and a DC power source according to the present invention. The cooling system is electrically connected to an external AC power source Vac and an external DC power source Vdc to drive at least one high-voltage cooling apparatus C1 and at least one low-voltage cooling apparatus C2. The cooling system includes an AC input subsystem 10, a DC input subsystem 20, and a driving control subsystem 30. The AC input subsystem 10 receives the external AC power source Vac to provide a first DC voltage Vo1 and a second DC voltage Vo2. In particular, the second DC voltage Vo2 is provided by stepping down the first DC voltage Vo1. In addition, the AC input subsystem 10 further provides a high-voltage auxiliary power source Vau1. The DC input subsystem 20 receives the external DC power source Vdc to provide a third DC voltage Vo3 and a fourth DC voltage Vo4. In particular, the fourth DC voltage Vo4 is provided by stepping up the third DC voltage Vo3. In addition, the DC input subsystem 20 further provides a low-voltage auxiliary power source Vau2. The driving control subsystem 30 is electrically connected to the AC input subsystem 10 and the DC input subsystem 20 to receive the first DC voltage Vo1, the second DC voltage Vo2, the third DC voltage Vo3, the fourth DC voltage Vo4, the high-voltage auxiliary power source Vau1, and the low-voltage auxiliary power source Vau2.

Especially, after the cooling system is electrically connected to the external AC power source Vac and the external DC power source Vdc, the high-voltage auxiliary power source Vau1 and the low-voltage auxiliary power source Vau2 are provided to supply the required electricity for internal circuits inside the driving control subsystem 30. Hence, the cooling system is operated in a standby condition after being powered on thereof. The driving control subsystem 30 controls the first DC voltage Vo1 (namely, the first DC voltage Vo1 is a high-voltage DC voltage) to supply power to the high-voltage cooling apparatus C1 and controls the second DC voltage Vo2 (namely, the second DC voltage Vo2 is a low-voltage DC voltage and is converted by stepping down the first DC voltage Vo1) to supply power to the low-voltage cooling apparatus C2 when the driving control subsystem 30 detects that the external AC power source Vac normally supplies power. In addition, the driving control subsystem 30 controls the third DC voltage Vo3 (namely, the third DC voltage Vo3 is a low-voltage DC voltage) to supply power to the low-voltage cooling apparatus C2 and controls the fourth DC voltage Vo4 (namely, the fourth DC voltage Vo4 is a high-voltage DC voltage and is converted by stepping up the third DC voltage Vo3) to supply power to the high-voltage cooling apparatus C1 when the driving control subsystem 30 detects that the external AC power source Vac abnormally supplies power and the external DC power source Vdc normally supplies power.

Figure 4:
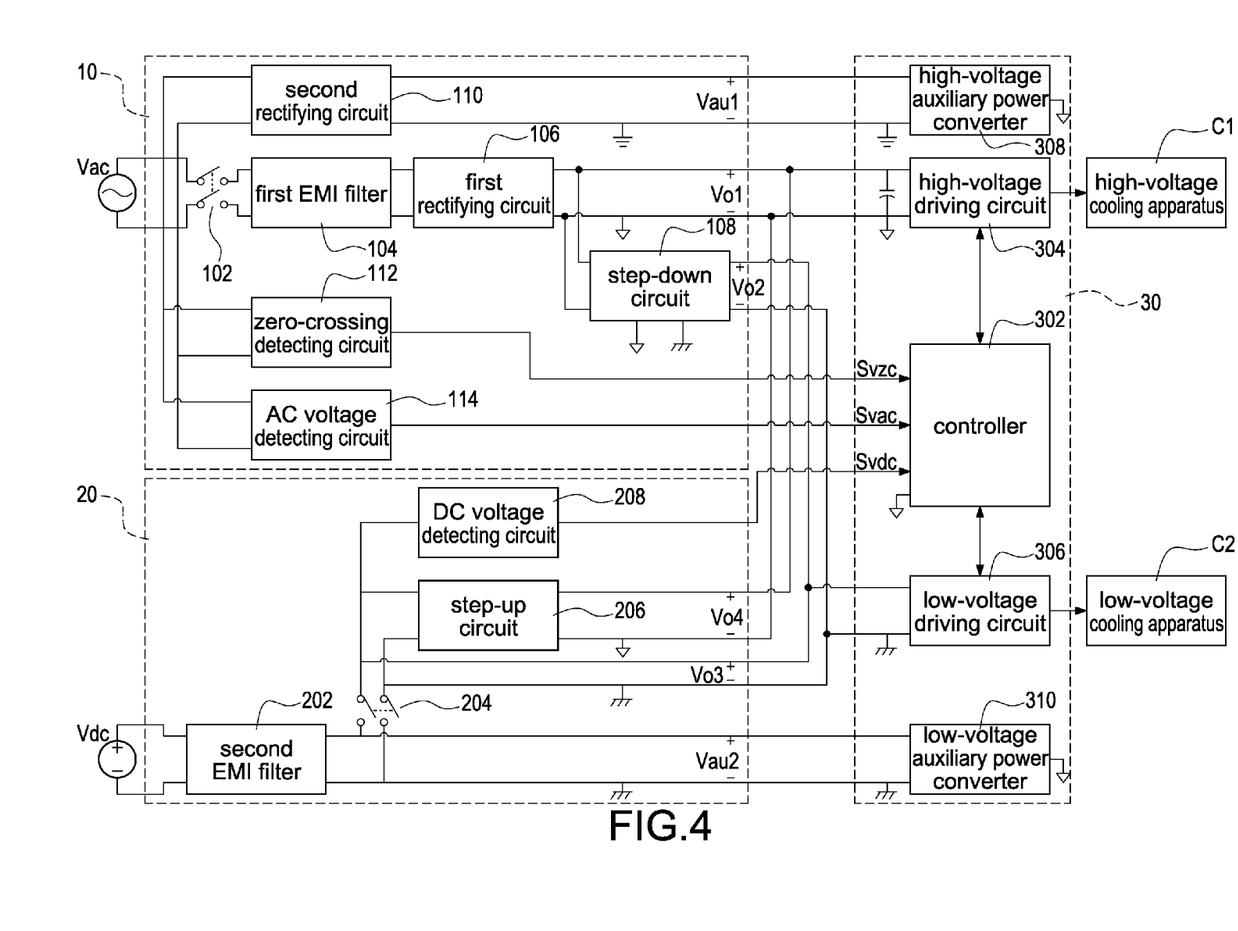
FIG. 4 is a schematic circuit block diagram of the cooling system of the server with an AC power source and a DC power source according to the present invention.

The detailed operation of the cooling system of the server with an AC power source and a DC power source will be described hereinafter as follows. Reference is made to FIG. 4 which is a schematic circuit block diagram of the cooling system of the server with an AC power source and a DC power source according to the present invention. As mentioned above, the cooling system includes the AC input subsystem 10, the DC input subsystem 20, and the driving control subsystem 30. The AC input subsystem 10 receives the external AC power source Vac to provide the first DC voltage Vo1, the second DC voltage Vo2, and the high-voltage auxiliary power source Vau1. In addition, the DC input subsystem 20 receives the external DC power source Vdc to provide the third DC voltage Vo3, the fourth DC voltage Vo4, and the low-voltage auxiliary power source Vau2.

The AC input subsystem 10 includes an AC control switch 102, a first EMI filter 104, a first rectifying circuit 106, a step-down circuit 108, a second rectifying circuit 110, a zero-crossing detecting circuit 112, and an AC voltage detecting circuit 114. The AC control switch 102 receives the external AC power source Vac. The first EMI filter 104 is electrically connected to the AC control switch 102 to eliminate noises in the external AC power source Vac. The first rectifying circuit 106 is electrically connected to the first EMI filter 104 to rectify the external AC power source Vac and output the first DC voltage Vo1. The step-down circuit 108 is electrically connected to the first rectifying circuit 106 to receive the first DC voltage Vo1 and output the second DC voltage Vo2 by stepping down the first DC voltage Vo1. In addition, the second rectifying circuit 110 receives the external AC power source Vac to rectify the external AC power source Vac and output the high-voltage auxiliary power source Vau1, thus supplying the required electricity for internal circuits inside the driving control subsystem 30. Hence, the cooling system is operated in a standby condition after being powered on thereof. The zero-crossing detecting circuit 112 receives the external AC power source Vac to detect zero-crossing points of the external AC power source Vac and output a zero-crossing signal Svzc. The AC voltage detecting circuit 114 receives the external AC power source Vac to detect a voltage amplitude of the external AC power source Vac and output an AC voltage signal Svac.

The DC input subsystem 20 includes a second EMI filter 202, a DC control switch 204, a step-up circuit 206, and a DC voltage detecting circuit 208. The second EMI filter 202 receives the external DC power source Vdc to eliminate noises in the external DC power source Vdc and output the low-voltage auxiliary power source Vau2. The DC control switch 204 is electrically connected to the second EMI filter 202 to introduce the external DC power source Vdc as the third DC voltage Vo3. The step-up circuit 206 is electrically connected to the DC control switch 204 to receive the third DC voltage Vo3 and output the fourth DC voltage Vo4 by stepping up the third DC voltage Vo3. In addition, the DC voltage detecting circuit 208 receives the external DC power source Vdc via the DC control switch 204 and the second EMI filter 202 to detect a voltage amplitude of the external DC power source Vdc and output a DC voltage signal Svdc.

The driving control subsystem 30 is electrically connected to the AC input subsystem 10 and the DC input subsystem 20. The driving control subsystem 30 includes a controller 302, a high-voltage driving circuit 304, a low-voltage driving circuit 306, a high-voltage auxiliary power converter 308, and a low-voltage auxiliary power converter 310. The high-voltage driving circuit 304 is electrically connected to the controller 302, the first rectifying circuit 106, and the step-up circuit 206 to receive the first DC voltage Vo1 or the fourth DC voltage Vo4 to drive the high-voltage cooling apparatus C1. The low-voltage driving circuit 306 is electrically connected to the controller 302, the DC control switch 204, and the step-down circuit 108 to receive the second DC voltage Vo2 or the third DC voltage Vo3 to drive the low-voltage cooling apparatus C2. In addition, the high-voltage auxiliary power converter 308 receives the high-voltage auxiliary power source Vau1 and converts a voltage amplitude of the high-voltage auxiliary power source Vau1 to supply the required electricity for internal high-voltage circuits inside the driving control subsystem 30. The low-voltage auxiliary power converter 310 receives the low-voltage auxiliary power source Vau2 and converts a voltage amplitude of the low-voltage auxiliary power source Vau2 to supply the required electricity for internal low-voltage circuits inside the driving control subsystem 30.

The detailed operation of controlling the cooling system of the server with an AC power source and a DC power source will be described hereinafter as follows. When the external AC power source Vac and the external DC power source Vdc are introduced to power on the cooling system, the AC input subsystem 10 and the DC input subsystem 20 provide the high-voltage auxiliary power source Vau1 and the low-voltage auxiliary power source Vau2 to the driving control subsystem 30, respectively. In particular, the voltage amplitude of the high-voltage auxiliary power source Vau1 is converted by the high-voltage auxiliary power converter 308 to supply the required electricity for internal high-voltage circuits inside the driving control subsystem 30. The voltage amplitude of the low-voltage auxiliary power source Vau2 is converted by the low-voltage auxiliary power converter 310 to supply the required electricity for internal low-voltage circuits inside the driving control subsystem 30. At this time, the controller 302 controls the cooling system entering a standby condition and the high-voltage cooling apparatus C1 and the low-voltage cooling apparatus C2 are in non-operative condition. In particular, the high-voltage cooling apparatus C1 can be a high-voltage compressor and the low-voltage cooling apparatus C2 can be a low-voltage fan. However, the embodiment is only exemplified but not intended to limit the scope of the disclosure. Afterward, when the controller 302 detects that the external AC power source Vac normally supplies power, the controller 302 turns off the DC control switch 204 and turns on the AC control switch 102, thus controlling the cooling system entering an AC operation condition. That is, the cooling system is supplied power by the external AC power source Vac. In particular, the controller 302 judges whether a frequency of the external AC power source Vac is normal according to the zero-crossing signal Svzc. Also, the controller 302 judges whether the amplitude of the external AC power source Vac is normal according to the AC voltage signal Svac. Especially, the external AC power source Vac is regarded as the normal power supply when both the frequency and the voltage amplitude of the external AC power source Vac are normal. In addition, when the controller 302 detects that the external AC power source Vac abnormally supplies power and the external DC power source Vdc normally supplies power, the controller 302 turns off the AC control switch 102 and turns on the DC control switch 204, thus controlling the cooling system entering a DC operation condition. That is, the cooling system is supplied power by the external DC power source Vdc. In particular, the controller 302 judges whether the amplitude of the external DC power source Vdc is normal according to the DC voltage signal Svdc. Especially, the external DC power source Vdc is regarded as the normal power supply when the voltage amplitude of the external DC power source Vdc is normal. In addition, the controller 302 controls the cooling system entering the standby condition when the external AC power source Vac and the external DC power source Vdc are both abnormal.

In other words, when the cooling system is powered on to enter the standby condition, the controller 302 first detects whether the external AC power source Vac is normal. If the frequency and the amplitude of the external AC power source Vac are both normal, the controller 302 turns off the DC control switch 204 and turns on the AC control switch 102 so that the cooling system is supplied power by the external AC power source Vac (namely, the cooling system enters the AC operation condition). Afterward, the controller 302 still detects whether the frequency and the amplitude of the external AC power source Vac are both normal. If the frequency and the amplitude of the external AC power source Vac are both normal, the cooling system is still supplied power by the external AC power source Vac. If any one of the frequency or the amplitude of the external AC power source Vac is abnormal, the external AC power source Vac is regarded as the abnormal power supply. Hence, the controller 302 controls the high-voltage cooling apparatus C1 (the high-voltage compressor) and the low-voltage cooling apparatus C2 (the low-voltage fan) are in non-operative condition. At this time, the controller 302 sends a warning notification to indicate that the external AC power source Vac is abnormal. Hence, the controller 302 turns off the AC control switch 102 and turns on the DC control switch 204 and then detects that whether the external DC power source Vdc is normal. If the amplitude of the external DC power source Vdc is abnormal, the controller 302 controls the high-voltage cooling apparatus C1 (the high-voltage compressor) and the low-voltage cooling apparatus C2 (the low-voltage fan) are in non-operative condition. At this time, the controller 302 sends a warning notification to indicate that the external AC power source Vac and the external DC power source Vdc are both abnormal and then the controller 302 controls the cooling system entering the standby condition. If the amplitude of the external DC power source Vdc is normal, the cooling system is supplied power by the external DC power source Vdc (namely, the cooling system enters the DC operation condition). Afterward, the controller 302 still detects whether the amplitude of the external DC power source Vdc is normal. If the amplitude of the external DC power source Vdc is normal, the controller 302 further detects whether the external AC power source Vac is normal (namely, the external AC power source Vac whether restores to normally supply power). If the external AC power source Vac has not been restored to normally supply power, the cooling system is still supplied power by the external DC power source Vdc. If the external AC power source Vac has been restored to normally supply power, the controller 302 controls the high-voltage cooling apparatus C1 (the high-voltage compressor) and the low-voltage cooling apparatus C2 (the low-voltage fan) are in non-operative condition. At this time, the controller 302 sends a warning notification to indicate that the external AC power source Vac is normal. Hence, the controller 302 turns off the DC control switch 204 and turns on the AC control switch 102 so that the cooling system is supplied power by the external AC power source Vac.

As mentioned above, if the controller 302 detects that the amplitude of the external DC power source Vdc is abnormal when the cooling system is supplied power by the external DC power source Vdc, the controller 302 controls the high-voltage cooling apparatus C1 (the high-voltage compressor) and the low-voltage cooling apparatus C2 (the low-voltage fan) are in non-operative condition. At this time, the controller 302 sends a warning notification to indicate that the external AC power source Vac and the external DC power source Vdc are both abnormal and then the controller 302 controls the cooling system entering the standby condition. If any one of the frequency or the amplitude of the external AC power source Vac is abnormal when the cooling system is powered on to enter the standby condition, the controller 302 turns off the AC control switch 102 and turns on the DC control switch 204 and then detects that whether the external DC power source Vdc is normal. If the amplitude of the external DC power source Vdc is normal, the cooling system is supplied power by the external DC power source Vdc. If the amplitude of the external DC power source Vdc is abnormal, the controller 302 controls the high-voltage cooling apparatus C1 (the high-voltage compressor) and the low-voltage cooling apparatus C2 (the low-voltage fan) are in non-operative condition. At this time, the controller 302 sends a warning notification to indicate that the external AC power source Vac and the external DC power source Vdc are both abnormal and then the controller 302 controls the cooling system entering the standby condition.

Figure 5:
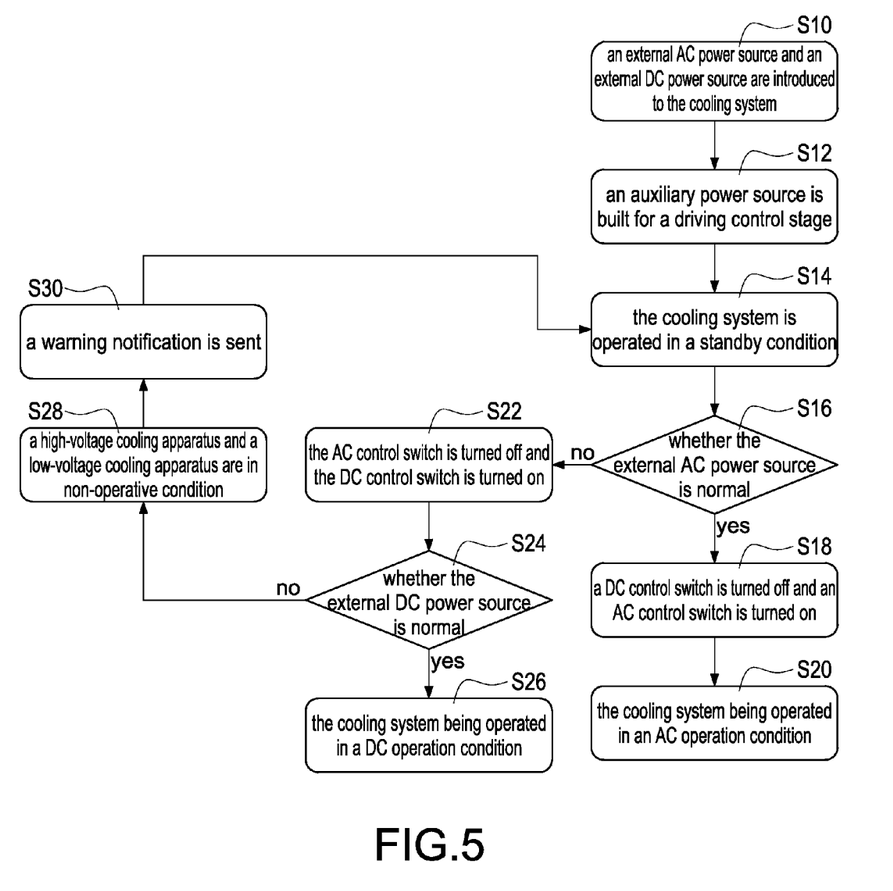
FIG. 5 is a flowchart of a method of operating the cooling system according to the present invention.

Reference is made to FIG. 5 which is a flowchart of a method of operating the cooling system according to the present invention. The method includes following steps: an external AC power source and an external DC power source are introduced to the cooling system (S10) to build an auxiliary power source for a driving control stage (S12), thus supplying the required electricity for the driving control stage. Hence, the cooling system is operated in a standby condition after being powered on thereof (S14). Afterward, it is to judge whether the external AC power source is normal (S16). If the external AC power source is normal, a DC control switch is turned off and an AC control switch is turned on (S18), thus controlling the cooling system being operated in an AC operation condition (S20). That is, the cooling system is supplied power by the external AC power source. Especially, the external AC power source is regarded as the normal power supply when both the frequency and the amplitude of the external AC power source are normal, whereas the external AC power source is regarded as the abnormal power supply when any one of the frequency or the amplitude of the external AC power source is abnormal. In the step (S16), if the external AC power source is abnormal, the AC control switch is turned off and the DC control switch is turned on (S22). Afterward, it is to judge whether the external DC power source is normal (S24). If the external DC power source is normal, the cooling system is controlled being operated in a DC operation condition (S26). That is, the cooling system is supplied power by the external DC power source. Especially, the external DC power source is regarded as the normal power supply when the amplitude of the external DC power source is normal. In the step (S24), if the external DC power source is abnormal, a high-voltage cooling apparatus, such as a high-voltage compressor, and a low-voltage cooling apparatus, such as a low-voltage fan, are in non-operative condition (S28). At this time, a warning notification is sent (S30) and then the cooling system is controlled entering the standby condition (S14).

Figure 6:
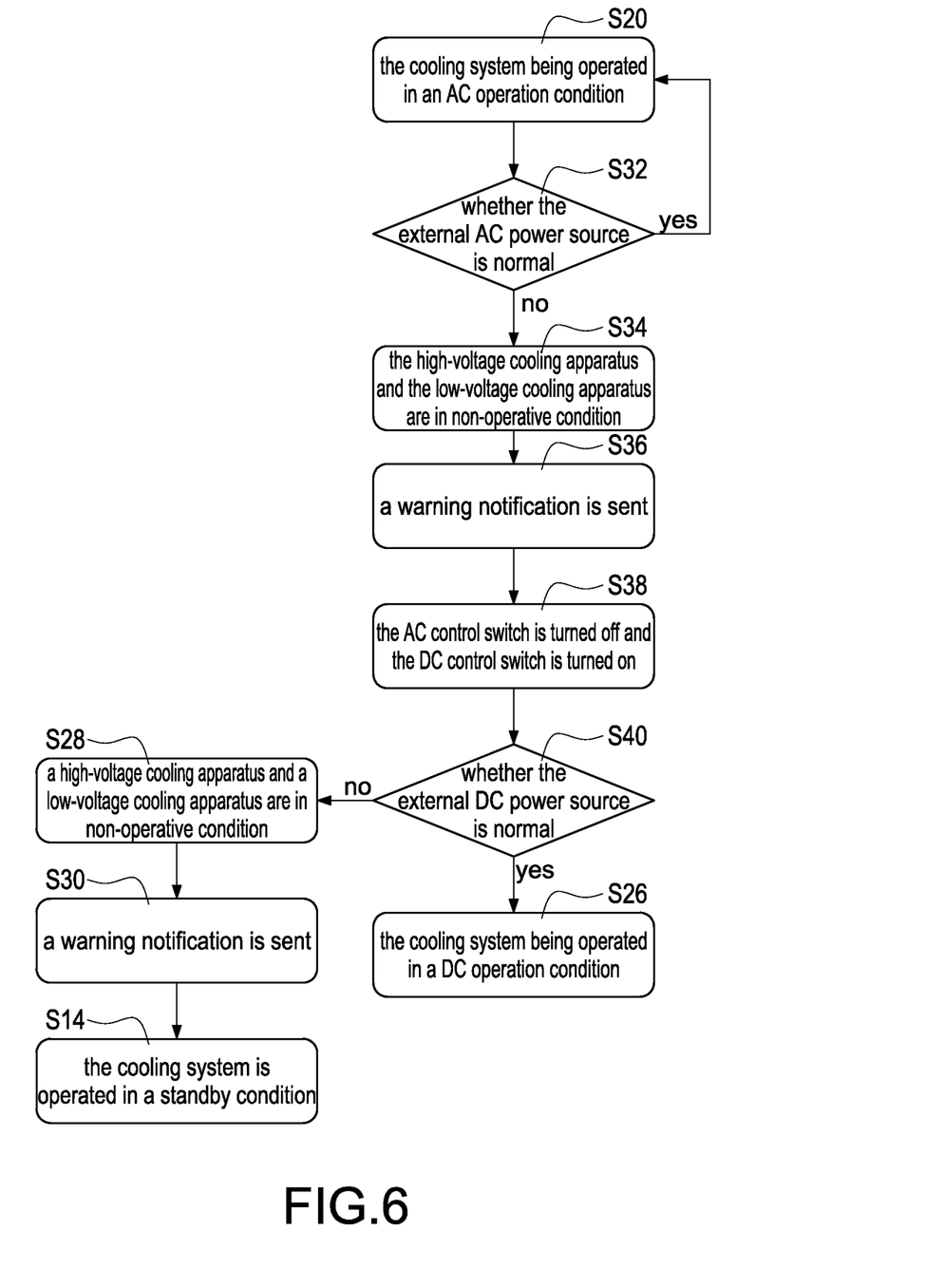
FIG. 6 is a flowchart of supplying power to the cooling system by the AC power source according to the present invention.

Reference is made to FIG. 6 which is a flowchart of supplying power to the cooling system by the AC power source according to the present invention. As mentioned above, the step (S20) indicates that the cooling system enters the AC operation condition. Afterward, it is to judge whether the external AC power source is normal (S32). If the external AC power source is normal, the cooling system is still supplied power by the external AC power source (namely, the cooling system is in the AC operation condition) (S20). In addition, in the step (S32), if the external AC power source is abnormal, the high-voltage cooling apparatus and the low-voltage cooling apparatus are in non-operative condition (S34). At this time, a warning notification is sent (S36) and then the AC control switch is turned off and the DC control switch is turned on (S38). Afterward, it is to judge whether the external DC power source is normal (S40). If the external DC power source is normal, the cooling system is controlled being operated in the DC operation condition (S26). In addition, in the step (S40), if the external DC power source is abnormal, the high-voltage cooling apparatus and the low-voltage cooling apparatus are in non-operative condition (S28). At this time, a warning notification is sent (S30) and then the cooling system is controlled entering the standby condition (S14).

Figure 7:
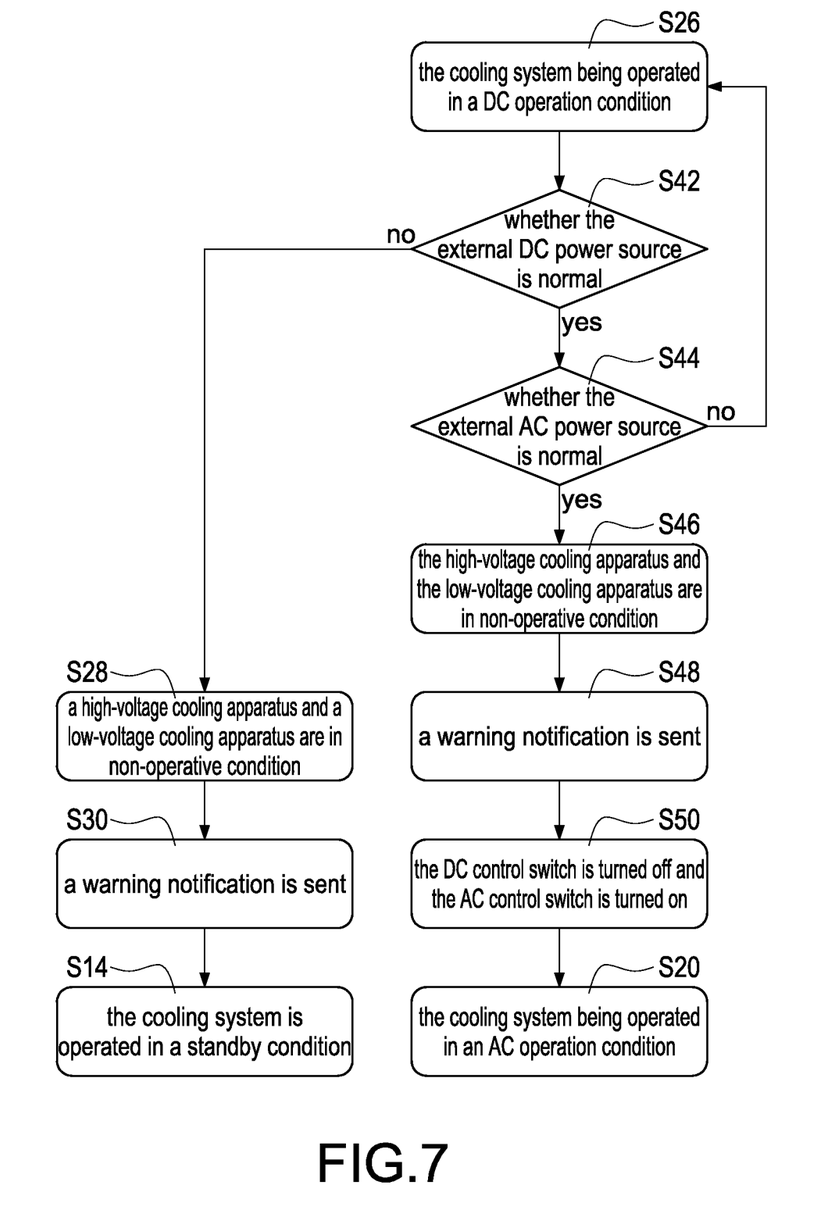
FIG. 7 is a flowchart of supplying power to the cooling system by the DC power source according to the present invention.

Reference is made to FIG. 7 which is a flowchart of supplying power to the cooling system by the DC power source according to the present invention. As mentioned above, the step (S26) indicates that the cooling system enters the DC operation condition. Afterward, it is to judge whether the external DC power source is normal (S42). If the external DC power source is normal, it is to further judge whether the external AC power source is normal (namely, the external AC power source whether restores to normally supply power) (S44). If the external AC power source is abnormal, the cooling system is still supplied power by the external DC power source (namely, the cooling system is in the DC operation condition) (S26). In addition, in the step (S44), if the external AC power source is normal, the high-voltage cooling apparatus and the low-voltage cooling apparatus are in non-operative condition (S46). At this time, a warning notification is sent (S48) and then the DC control switch is turned off and the AC control switch is turned on (S50) and the cooling system is controlled entering the AC operation condition (S20). In addition, in the step (S42), if the external DC power source is abnormal, the high-voltage cooling apparatus and the low-voltage cooling apparatus are in non-operative condition (S28). At this time, a warning notification is sent (S30) and then the cooling system is controlled entering the standby condition (S14).

Figure 8:
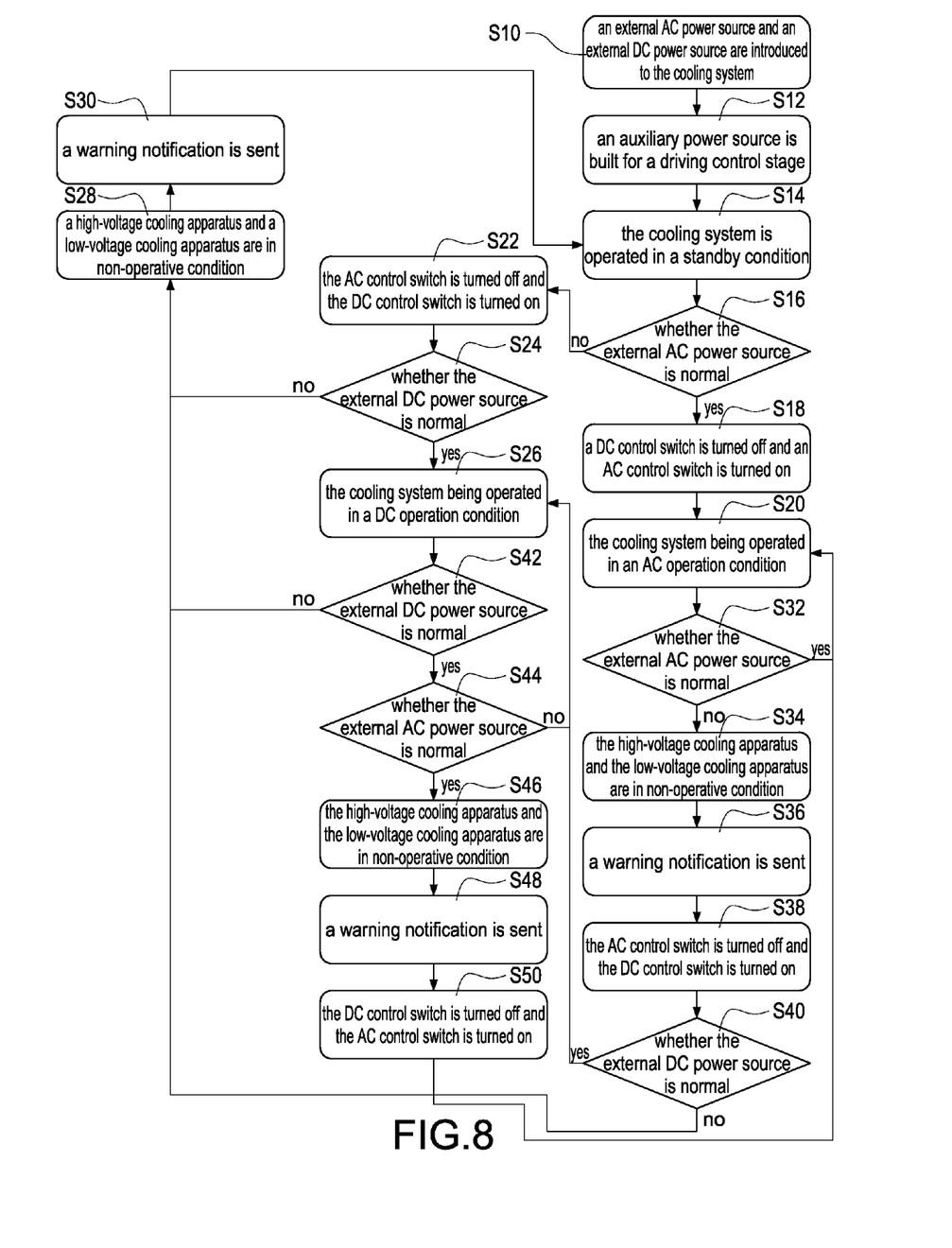
FIG. 8 is a flowchart of supplying power to the cooling system by both the AC power source and the DC power source according to the present invention.

Reference is made to FIG. 8 which is a flowchart of supplying power to the cooling system by both the AC power source and the DC power source according to the present invention. In particularly, the FIG. 8 includes all steps disclosed in the FIG. 5, FIG. 6, and FIG. 7. Especially, the cooling system includes a controller which is the core of judging, controlling, and operating operations. The complete operation of the cooling system is described as follows. When the cooling system is powered on to enter the standby condition (S14), the controller first detects whether the external AC power source is normal (S16). If the frequency and the amplitude of the external AC power source are both normal, the controller turns off the DC control switch and turns on the AC control switch (S18) so that the cooling system is supplied power by the external AC power source (namely, the cooling system enters the AC operation condition) (S20). Afterward, the controller still detects whether the frequency and the amplitude of the external AC power source are both normal (S32). If the frequency and the amplitude of the external AC power source are both normal, the cooling system is still supplied power by the external AC power source (S20). If any one of the frequency or the amplitude of the external AC power source is abnormal, the external AC power source is regarded as the abnormal power supply. Hence, the controller controls the high-voltage cooling apparatus (the high-voltage compressor) and the low-voltage cooling apparatus (the low-voltage fan) are in non-operative condition (S34). At this time, the controller sends a warning notification to indicate that the external AC power source is abnormal (S36). Hence, the controller turns off the AC control switch and turns on the DC control switch (S38) and then detects that whether the external DC power source is normal (S40). If the amplitude of the external DC power source is abnormal, the controller controls the high-voltage cooling apparatus (the high-voltage compressor) and the low-voltage cooling apparatus (the low-voltage fan) are in non-operative condition (S28). At this time, the controller sends a warning notification to indicate that the external AC power source and the external DC power source are both abnormal (S30) and then the controller controls the cooling system entering the standby condition (S14). If the amplitude of the external DC power source is normal, the cooling system is supplied power by the external DC power source (namely, the cooling system enters the DC operation condition) (S26). Afterward, the controller still detects whether the amplitude of the external DC power source is normal (S42). If the amplitude of the external DC power source is normal, the controller further detects whether the external AC power source is normal (namely, the external AC power source whether restores to normally supply power) (S44). If the external AC power source has not been restored to normally supply power, the cooling system is still supplied power by the external DC power source (S26). If the external AC power source has been restored to normally supply power, the controller controls the high-voltage cooling apparatus (the high-voltage compressor) and the low-voltage cooling apparatus (the low-voltage fan) are in non-operative condition (S46). At this time, the controller sends a warning notification to indicate that the external AC power source is normal (S48). Hence, the controller turns off the DC control switch and turns on the AC control switch (S50) so that the cooling system is supplied power by the external AC power source (S20).

As mentioned above, if the controller detects that the amplitude of the external DC power source is abnormal when the cooling system is supplied power by the external DC power source (S26), the controller controls the high-voltage cooling apparatus (the high-voltage compressor) and the low-voltage cooling apparatus (the low-voltage fan) are in non-operative condition (S28). At this time, the controller sends a warning notification to indicate that the external AC power source and the external DC power source are both abnormal (S30) and then the controller controls the cooling system entering the standby condition (S14). If any one of the frequency or the amplitude of the external AC power source is abnormal when the cooling system is powered on to enter the standby condition (S14), the controller turns off the AC control switch and turns on the DC control switch (S22) and then detects that whether the external DC power source is normal (S24). If the amplitude of the external DC power source is normal, the cooling system is supplied power by the external DC power source (S26). If the amplitude of the external DC power source is abnormal, the controller controls the high-voltage cooling apparatus (the high-voltage compressor) and the low-voltage cooling apparatus (the low-voltage fan) are in non-operative condition (S28). At this time, the controller sends a warning notification to indicate that the external AC power source and the external DC power source are both abnormal (S30) and then the controller controls the cooling system entering the standby condition (S14).

In conclusion, the present disclosure has following advantages:

1. The external AC power source Vac has high priority in supplying power. If the external AC power source Vac is still normal when the external AC power source Vac supplies power, the cooling system is still supplied power by the external AC power source; whereas if the external AC power source Vac has been restored to normally supply power when the external DC power source Vdc supplies power, the external AC power source Vac is transferred to supply power to the cooling system;

2. During the transformation of the AC operation condition, the DC operation condition, or the standby condition, the high-voltage cooling apparatus C1 and the low-voltage cooling apparatus C2 are controlled in non-operative condition to ensure safe operation and increase use time of the cooling apparatuses;

3. The external AC power source Vac and the external DC power source Vdc are selectively used to commonly and separately (isolated) supply power so that the external AC power source Vac or the external DC power source Vdc can be selected to increase the flexibility of the cooling system according to the actual power supply environment;

4. Once the external AC power source Vac is abnormal, the external DC power source Vdc is automatically transferred to supply power to the cooling system so that the optimal power-supplying way is used to increase scope and reliability of supplying power according to the actual power supply environment; and 5. The external AC power source Vac and the external DC power source Vdc can be separately (without commonly grounding) used to supply power to ensure safety of supplying power under the isolated power supply environment.

Although the present disclosure has been described with reference to the preferred embodiment thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A cooling system of a server with an AC power source and a DC power source electrically connected to an external AC power source and an external DC power source to drive at least one high-voltage cooling apparatus and at least one low-voltage cooling apparatus, the cooling system comprising:

an AC input subsystem receiving the external AC power source to provide a first DC voltage and a second DC voltage, wherein the second DC voltage is provided by stepping down the first DC voltage;

a DC input subsystem receiving the external DC power source to provide a third DC voltage and a fourth DC voltage, wherein the fourth DC voltage is provided by stepping up the third DC voltage; and a driving control subsystem electrically connected to the AC input subsystem and the DC input subsystem to receive the first DC voltage, the second DC voltage, the third DC voltage, and the fourth DC voltage;

wherein the driving control subsystem controls the first DC voltage and the second DC voltage to respectively supply power to the high-voltage cooling apparatus and the low-voltage cooling apparatus when the external AC power source normally supplies power; the driving control subsystem controls the fourth DC voltage and the third DC voltage to respectively supply power to the high-voltage cooling apparatus and the low-voltage cooling apparatus when the external DC power source normally supplies power and the external AC power source does not normally supply power.

2. The cooling system in claim 1, wherein the AC input subsystem comprises:
an AC control switch receiving the external AC power source;
a first EMI filter electrically connected to the AC control switch and configured to eliminate noises in the external AC power source;
a first rectifying circuit electrically connected to the first EMI filter and configured to rectify the external AC power source to output the first DC voltage; and
a step-down circuit electrically connected to the first rectifying circuit to receive the first DC voltage and configured to step down the first DC voltage to output the second DC voltage;
wherein the DC input subsystem comprises:
a second EMI filter receiving the external DC power source and configured to eliminate noises in the external DC power source and output a low-voltage auxiliary power source;
a DC control switch electrically connected to the second EMI filter and configured to introduce the external DC power source as a third DC voltage; and
a step-up circuit electrically connected to the DC control switch to receive the third DC voltage and configured to step up the third DC voltage to output the fourth DC voltage; and
wherein the driving control subsystem comprises:
a controller;
a high-voltage driving circuit electrically connected to the controller, the first rectifying circuit, and the step-up circuit and configured to drive the high-voltage cooling apparatus; and
a low-voltage driving circuit electrically connected to the controller, the DC control switch, and the step-down circuit and configured to drive the low-voltage cooling apparatus.

3. The cooling system in claim 2, wherein the AC input subsystem further comprises:
a second rectifying circuit receiving the external AC power source and configured to rectify the external AC power source and output a high-voltage auxiliary power source;

a zero-crossing detecting circuit receiving the external AC power source and configured to detect zero-crossing points of the external AC power source and output a zero-crossing signal; and
an AC voltage detecting circuit receiving the external AC power source and configured to detect a voltage amplitude of the external AC power source and output an AC voltage signal;
wherein the DC input subsystem further comprises:
a DC voltage detecting circuit receiving the external DC power source via the DC control switch and the second EMI filter and configured to detect a voltage amplitude of the external DC power source and output an DC voltage signal;
wherein the driving control subsystem further comprises:
a high-voltage auxiliary power converter receiving the high-voltage auxiliary power source and configured to convert a voltage amplitude of the high-voltage auxiliary power source to provide a required electricity of the driving control subsystem; and
a low-voltage auxiliary power converter receiving the low-voltage auxiliary power source and configured to convert a voltage amplitude of the low-voltage auxiliary power source to provide the required electricity of the driving control subsystem.

4. The cooling system in claim 3, wherein the AC input subsystem and the DC input subsystem are configured to respectively provide the high-voltage auxiliary power source and the low-voltage auxiliary power source to the driving control subsystem so that the controller is configure to control the cooling system being operated in a standby condition when the external AC power source and the external DC power source are provided to the cooling system.

5. The cooling system in claim 3, wherein the controller is configured to turn off the DC control switch and turn on the AC control switch when the controller detects that the external AC power source normally supplies power, thus controlling the cooling system being operated in an AC operation condition; the controller is configured to turn off the AC control switch and turn on the DC control switch when the controller detects that the external AC power source abnormally supplies power and the external DC power source normally supplies power, thus controlling the cooling system being operated in a DC operation condition; when the controller detects that the external AC power source and the external DC power source both abnormally supplies power, the controller is configured to control the cooling system being operated in the standby condition.

6. The cooling system in claim 5, wherein the controller judges whether a frequency of the external AC power source is normal according to the zero-crossing signal and judges whether an amplitude of the external AC power source is normal according to the AC voltage signal; wherein the external AC power source is regarded as a normal power supply when both the frequency and the amplitude of the external AC power source are normal; the external AC power source is regarded as an abnormal power supply when any one of the frequency or the amplitude of the external AC power source is abnormal.

7. The cooling system in claim 5, wherein the controller judges whether an amplitude of the external DC power source is normal according to the DC voltage signal; wherein the external DC power source is regarded as a normal power supply when the voltage amplitude of the external DC power source is normal; the external DC power source is regarded as an abnormal power supply when the voltage amplitude of the external DC power source is abnormal.

8. The cooling system in claim 1, wherein the high-voltage cooling apparatus is a high-voltage compressor and the low-voltage cooling apparatus is a low-voltage fan.

9. A method of operating a cooling system of a server with an AC power source and a DC power source comprising following steps:
- (a) introducing an external AC power source and an external DC power source to the cooling system to build an auxiliary power source for a driving control stage, and then controlling the cooling system being operated in a standby condition;
- (b) judging whether the external AC power source is normal, wherein a DC control switch is turned off and an AC control switch is turned on when the external AC power source is normal, thus controlling the cooling system being operated in an AC operation condition;
- (c) turning off the AC control switch and turning on the DC control switch when the external AC power source is abnormal;
- (d) judging whether the external DC power source is normal, wherein the cooling system is controlled being operated in a DC operation condition when the external DC power source is normal; and
- (e) controlling the cooling system being operated in the standby condition when the external DC power source is abnormal.

10. The method of operating the cooling system in claim 9, wherein after the cooling system is operated in the AC operation condition in the step (b), further comprising:
- (b1) judging whether the external AC power source is normal, wherein the cooling system is controlled being still operated in the AC operation condition when the external AC power source is normal;
- (b2) turning off the AC control switch and turning on the DC control switch when the external AC power source is abnormal;
- (b3) judging whether the external DC power source is normal, wherein the cooling system is controlled being operated in the DC operation condition when the external DC power source is normal; and
- (b4) controlling the cooling system being operated in the standby condition when the external DC power source is abnormal.

11. The method of operating the cooling system in claim 9, wherein after the cooling system is operated in the DC operation condition in the step (d), further comprising:
- (d1) judging whether the external DC power source is normal; when the external DC power source is normal, judging whether the external AC power source is normal; when the external AC power is abnormal, the cooling system is controlled being still operated in the DC operation condition;
- (d2) turning off the DC control switch and turning on the AC control switch when the external AC power source is normal, thus controlling the cooling system being operated in the AC operation condition; and
- (d3) controlling the cooling system being operated in the standby condition when the external AC power source is abnormal.

12. The method of operating the cooling system in claim 9, wherein in the step (b), the external AC power source is regarded as a normal power supply when both a frequency and an amplitude of the external AC power source are normal; the external AC power source is regarded as an abnormal power supply when any one of the frequency or the amplitude of the external AC power source is abnormal.

13. The method of operating the cooling system in claim 9, wherein in the step (d), the external DC power source is regarded as an normal power supply when an amplitude of the external DC power source is normal; the external DC power source is regarded as an abnormal power supply when the amplitude of the external DC power source is abnormal.

* * * * *